US009726914B2

(12) United States Patent
Nakamura et al.

(10) Patent No.: US 9,726,914 B2
(45) Date of Patent: Aug. 8, 2017

(54) OPTICAL SIGNAL GENERATOR

(71) Applicant: Oclaro Japan, Inc., Sagamihara, Kanagawa (JP)

(72) Inventors: Atsushi Nakamura, Nagano (JP); Shunya Yamauchi, Kanagawa (JP); Noriko Sasada, Kanagawa (JP); Takayoshi Fukui, Kanagawa (JP); Nozomu Yasuhara, Kanagawa (JP)

(73) Assignee: OCLARO JAPAN, INC., Kanagawa (JP)

( * ) Notice: Subject to any disclaimer, the term of this patent is extended or adjusted under 35 U.S.C. 154(b) by 61 days.

(21) Appl. No.: 15/173,761

(22) Filed: Jun. 6, 2016

(65) Prior Publication Data

US 2016/0370609 A1 Dec. 22, 2016

(30) Foreign Application Priority Data

Jun. 16, 2015 (JP) .................................. 2015-121413

(51) Int. Cl.
| | |
|---|---|
| *G02F 1/01* | (2006.01) |
| *G02F 1/017* | (2006.01) |
| *H01S 5/026* | (2006.01) |
| *G02F 1/025* | (2006.01) |
| G02F 1/015 | (2006.01) |
| H01S 5/022 | (2006.01) |
| H01S 5/12 | (2006.01) |

(52) U.S. Cl.
CPC ........ *G02F 1/01708* (2013.01); *G02F 1/0121* (2013.01); *G02F 1/025* (2013.01); *H01S 5/0265* (2013.01); *G02F 2001/0157* (2013.01); *H01S 5/02248* (2013.01); *H01S 5/02276* (2013.01); *H01S 5/12* (2013.01)

(58) Field of Classification Search
None
See application file for complete search history.

(56) References Cited

U.S. PATENT DOCUMENTS 6,678,479 B1 1/2004 Naoe et al.
9,128,309 B1 * 9/2015 Robertson ............... G02F 1/035
(Continued)

FOREIGN PATENT DOCUMENTS

| JP | 05-257102 A | 10/1993 |
|---|---|---|
| JP | 2001-221985 A | 8/2001 |
| JP | 2005-352219 A | 12/2005 |

*Primary Examiner* — Hemang Sanghavi
(74) *Attorney, Agent, or Firm* — Mattingly & Malur, PC

(57) ABSTRACT

Preferable simultaneous achievement of the target characteristics with respect to both of the modulation bandwidth and the extinction ratio in the optical intensity modulation using the electro-absorption optical modulator is realized with a simple circuit configuration. The modulator integrated semiconductor laser element includes a plurality of EA modulators disposed in series in an optical signal path, and each adapted to absorb light in accordance with an applied voltage. The modulator driver for supplying the EA modulator with the applied voltage is provided for each of the EA modulators. The plurality of modulator drivers generates the applied voltage common to the plurality of EA modulators in accordance with a control signal. The modulator lengths of the plurality of EA modulators are set so that the closer to the light source the EA modulator is, the shorter the modulator length is.

7 Claims, 10 Drawing Sheets

(56) References Cited

U.S. PATENT DOCUMENTS

| | | | |
|---|---|---|---|
| 2002/0159665 A1* | 10/2002 | Burie | B82Y 20/00 |
| | | | 385/1 |
| 2003/0057456 A1* | 3/2003 | Wada | B82Y 20/00 |
| | | | 257/222 |
| 2004/0101316 A1 | 5/2004 | Naoe et al. | |
| 2005/0275920 A1 | 12/2005 | Sumi et al. | |
| 2009/0297088 A1* | 12/2009 | Koh | G02F 1/0121 |
| | | | 385/2 |
| 2010/0156679 A1* | 6/2010 | Ehrlichman | G02F 1/0121 |
| | | | 341/50 |

* cited by examiner

OPTICAL SIGNAL GENERATOR

CROSS-REFERENCE TO RELATED APPLICATION

The present application claims priority from Japanese application JP2015-121413 filed on Jun. 16, 2015, the content of which is hereby incorporated by reference into this application.

BACKGROUND OF THE INVENTION

1. Field of the Invention

The invention relates to an optical signal generator for generating an intensity-modulated optical signal using an electro-absorption optical modulator.

2. Description of the Related Art

As one of optical modulator for modulating the intensity of light, there can be cited an electro-absorption optical modulator (EA modulator) using an electro-absorption effect of a semiconductor. The electro-absorption effect is a phenomenon that the difference in energy levels between the conduction band and the valence band is varied by applying an electric field to a semiconductor having a quantum well structure, and thus, the absorption of the light propagating through the quantum well structure varies.

The EA modulator is configured including a PIN junction with a double heterostructure having an optical waveguide layer provided with a multiple quantum well (MQW) structure sandwiched by a p-type semiconductor and an n-type semiconductor, a p-side electrode, and an n-side electrode for applying a voltage to the PIN junction.

If a voltage is applied to the PIN junction, an electric field is applied to the optical waveguide layer, and therefore, the light having been input to the optical waveguide layer is absorbed to create electron-hole pairs. As a result, the light passing through the optical waveguide layer decreases, and an OFF state of the optical signal is realized. In contrast, if no voltage is applied to the PIN junction, the light passes through the optical waveguide layer without being absorbed or quenched, and therefore, an ON state of the optical signal is realized.

In other words, the EA modulator varies the absorption of the light propagating through the optical waveguide layer in accordance with the voltage applied to the PIN junction to thereby realize the intensity modulation of the light. For example, by inputting a laser beam into the optical waveguide layer of the EA modulator, and then applying a voltage corresponding to a high-frequency modulation signal between the p-side electrode and the n-side electrode of the EA modulator, it is possible to obtain a modulated signal which is the laser beam modulated with the high-frequency signal.

SUMMARY OF THE INVENTION

The extinction ratio in the EA modulator depends on the length of the EA modulator (modulator length) and the applied voltage from a drive circuit to the EA modulator, and the longer the modulator length is, and the higher the applied voltage is, the higher the extinction ratio becomes.

Here, when realizing the high-speed optical intensity modulation using the EA modulator, there is a trade-off problem between the modulation bandwidth and the extinction ratio. Specifically, broadening of the modulation bandwidth of the EA modulator can be achieved by reducing the capacitance of the EA modulator, and it is possible to achieve the reduction of the capacitance by shortening the modulator length. However, on the other hand, by shortening the modulator length, the extinction ratio is decreased. Therefore, it is one of the problems to be solved in the EA modulator to satisfy both of the target characteristics with respect to the modulation bandwidth and the extinction ratio at the same time.

To cope with the problem, there can be cited a solution that the electrode of the EA modulator is divided, a plurality of EA modulators with relatively short modulator length is serially arranged along the optical signal path, and the EA modulators are driven by respective drive circuits. However, the electrical characteristics viewed from the drive circuits of the respective EA modulators arranged in series can basically be different from each other including the case of uniforming the modulator length. Therefore, there can arise a necessity to design or prepare the drive circuits to fit the respective EA modulators.

The problem will be described below. Even if the extinction ratio of the EA modulator is the same, the higher the intensity of the input light is, the larger the absolute value of the light absorbed by the EA modulator becomes, and the higher the photocurrent generated by the EA modulator becomes. Therefore, the electrical characteristics of the EA modulator viewed from the drive circuit vary in accordance with the intensity of the input light to the EA modulator. The influence of the photocurrent on the electrical characteristics is classified into a direct-current (DC) related influence and an alternating-current (AC) related influence. For example, as the DC-related influence on the electrical characteristics, an effective applied voltage to the EA modulator decreases due to an increase in the photocurrent, and as a result, the extinction ratio decreases. Further, as the AC-related influence on the electrical characteristics, the impedance of the EA modulator varies due to the increase in the photocurrent, and as a result, impedance mismatching can occur between the EA modulator and the drive circuit. For example, the impedance mismatching causes the reflection of the electrical signal between the EA modulator and the drive circuit, which results in an increase in noise in the optical signal to be modulated based on the electrical signal.

As a simple example, there is considered the case in which two EA modulators having the same modulator length are serially disposed. It is assumed that among the two EA modulators, one located on the light input side is referred to as an anterior modulator, and one located output side is referred to as a posterior modulator. Even if the same applied voltage is supplied from the drive circuit to each of the EA modulators, due to the difference in input optical intensity to the respective EA modulators, the photocurrent generated in the anterior modulator becomes higher than that of the posterior modulator. Therefore, focusing attention on the AC-related electrical characteristics, for example, a difference in impedance occurs between the anterior modulator and the posterior modulator. Although resolution of the impedance mismatching can be achieved by adjusting the inductance, the capacitance, and the electrical resistance in the electrical circuit formed of the drive circuit and the EA modulator, since the impedance is different by the EA modulator, it is necessary to perform a design or the like of the electrical circuit for each EA modulator, the man-hour and the cost necessary for the manufacture increase.

The invention has been made for solving the problems described above, and relates to an optical signal generator for generating an intensity-modulated optical signal using electro-absorption optical modulators, and realizes preferable simultaneous achievement of the target characteristics with respect to both of the modulation bandwidth and the extinction ratio with a simple circuit configuration.

(1) An optical signal generator according to the invention is a device adapted to modulate an intensity of an input optical signal from a light source with a modulation part based on a modulation signal to generate a modulated optical signal, wherein the modulation part includes a plurality of electro-absorption optical modulators disposed in series in an optical signal path, and each adapted to absorb light in accordance with an applied voltage, and a plurality of drive circuits disposed so as to correspond respectively to the plurality of electro-absorption optical modulators to supply the electro-absorption optical modulators with the applied voltages, and adapted to generate the applied voltage common to the plurality of electro-absorption optical modulators in accordance with a control signal, and modulator lengths of the plurality of electro-absorption optical modulators are set so that the closer to the light source the electro-absorption optical modulator is, the shorter the modulator length is set.

(2) In the optical signal generator according to a preferred aspect of the invention, the modulator lengths of the plurality of electro-absorption optical modulators are set so that the optical absorptions in the respective electro-absorption optical modulators become equal to each other.

(3) In the optical signal generator described in one of (1) and (2), it is possible to adopt a configuration in which an optical semiconductor element provided with the electro-absorption optical modulator has an electrode pad, to which a wire for supplying the applied voltage is connected, with respect to at least one of polarities, namely a positive terminal and a negative terminal, of the electro-absorption optical modulator, the electrode pad being disposed on a surface of the optical semiconductor element, and the electrode pads of the same polarity in the two electro-absorption optical modulators adjacent to each other in the optical signal path are disposed on respective sides opposite to each other about the optical signal path.

(4) In the optical signal generator described in one of (1) and (2), it is possible to adopt a configuration in which an optical semiconductor element provided with the electro-absorption optical modulator has electrode pads, to which wires for supplying the applied voltage are connected, with respect to a positive terminal and a negative terminal of the electro-absorption optical modulator, the electrode pads being disposed on a surface of the optical semiconductor element, and an order of arrangement in a direction of the optical signal path related to the electrode pads of the positive terminal and the negative terminal of each of the electro-absorption optical modulators is reversed between the two electro-absorption optical modulators adjacent to each other on the optical signal path.

(5) An optical signal generator according to the invention is a device adapted to modulate an intensity of an input optical signal from a light source with a modulation part based on a modulation signal to generate a modulated optical signal, wherein the modulation part includes a plurality of electro-absorption optical modulators disposed in series in an optical signal path, and each adapted to absorb light in accordance with an applied voltage, and a drive circuit adapted to output a voltage corresponding to the modulation signal, and the plurality of electro-absorption optical modulators is electrically connected in series to each other to the drive circuit.

(6) In the optical signal generator described in (5), it is possible to adopt a configuration in which an electrical resistance is connected in parallel to each of the plurality of electro-absorption optical modulators.

(7) In the optical signal generator described in (5), it is possible to adopt a configuration in which an electrical resistance is connected to the drive circuit in parallel to the plurality of electro-absorption optical modulators connected in series to each other.

According to the invention, relating to an optical signal generator for generating an intensity-modulated optical signal using electro-absorption optical modulators, it becomes possible to preferably realize the target characteristics with respect to both of the modulation bandwidth and the extinction ratio with a simple circuit configuration.

DETAILED DESCRIPTION OF THE INVENTION

Some embodiments of the invention will hereinafter be described based on the accompanying drawings.

First Embodiment

The optical signal generator according to the present embodiment is an optical transmitter module equipped with a modulator integrated semiconductor laser element 2 having the EA modulators monolithically integrated in front of a semiconductor laser. The modulator integrated semiconductor laser element modulates the intensity of an optical signal, which is output by the semiconductor laser, based on a modulation signal in the modulation part to thereby generate a modulated optical signal. The modulation part is provided with a plurality of EA modulators serially connected to each other in the path of the optical signal.

Figure 1:
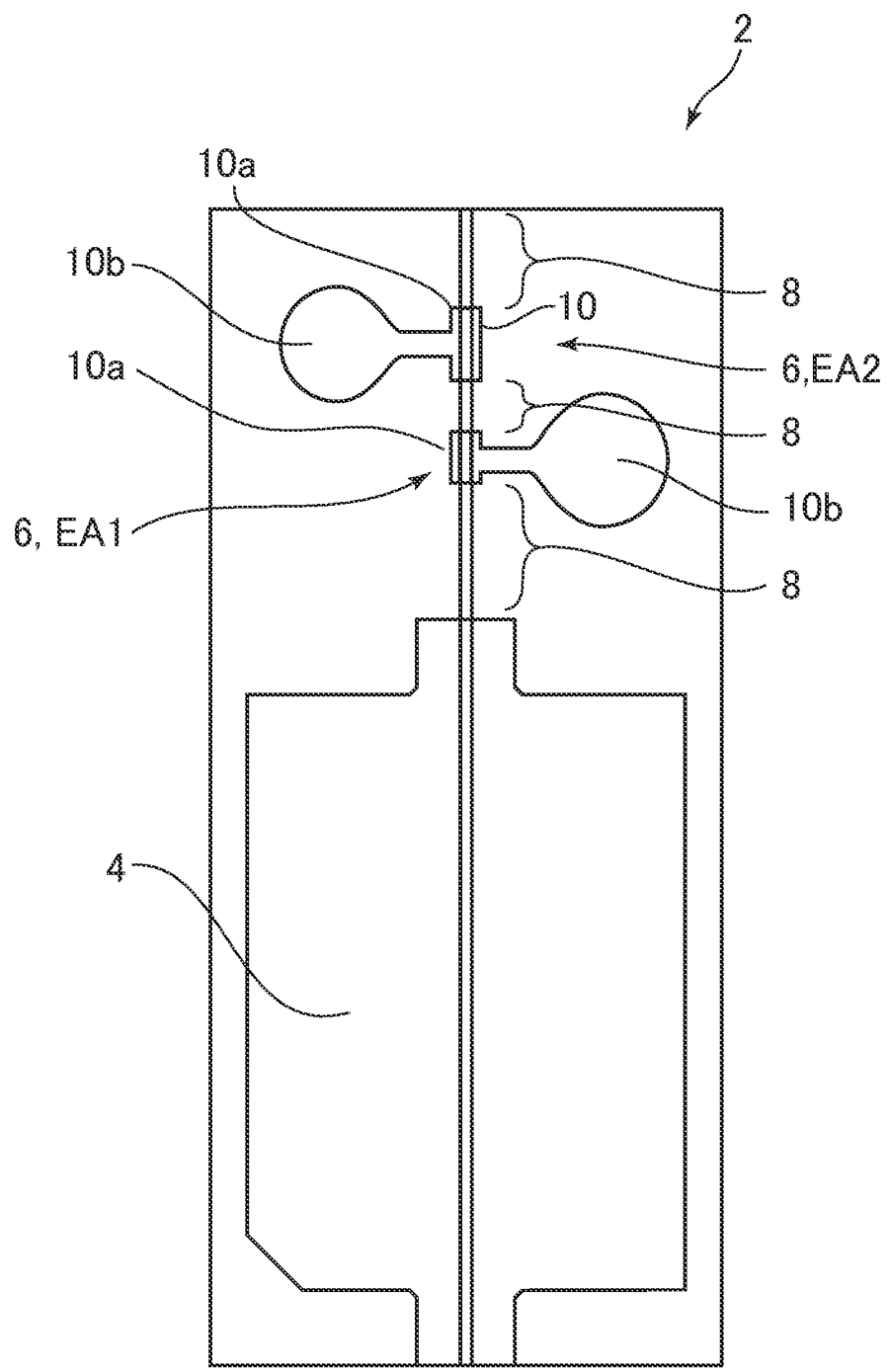
FIG. 1 is a schematic plan view of a modulator integrated semiconductor laser element according to a first embodiment of the invention.

FIG. 1 is a schematic plan view of the modulator integrated semiconductor laser element 2. The modulator integrated semiconductor laser element 2 includes a distributed feedback (DFB) laser part 4, the EA modulators 6 constituting the modulation part, and waveguides 8. The modulation part of the present embodiment includes two EA modulators. Here, the two EA modulators 6 are denoted by EA1, EA2 in sequence from the DFB laser part 4 side, wherein the DFB laser part 4 is a light source. The modulator lengths of the plurality of EA modulators constituting the modulation part are set so that the nearer to the light source, the shorter the modulator length is. Specifically, denoting the modulator length of the EA modulator EAk (k=1, 2) with $L_k$, $L_1 < L_2$ is fulfilled.

As already described, the EA modulators each have the structure of sandwiching the MQW active layer by the p-type and n-type semiconductor layers. In the present embodiment, the n-type semiconductor layer of the EA modulators EA1, EA2 is formed of an n-type indium-phosphorus (n-InP) substrate, the MQW active layer is formed on the substrate, and a p-type InP (p-InP) region is further formed on the MQW active layer as the p-type semiconductor layer described above. FIG. 1 shows p electrode parts 10 for applying the voltages to the respective p-InP regions of the EA modulators EA1, EA2. The p electrode parts 10 each have a contact part 10a having ohmic contact with the p-InP region and a pad part 10b. In FIG. 1, the difference in modulator length between the EA modulators EA1, EA2 appears in the lengths in the optical signal path direction of the contact parts 10a. It should be noted that the pad part 10b is a driving electrode pad for bonding a wire for supplying the EA modulator 6 with the drive voltage, and in FIG. 1, the pad part 10b has, for example, a roughly circular shape.

Here, assuming that the p-type semiconductor layer of the EA modulator 6 is a positive terminal, and the n-type semiconductor layer is a negative terminal, the p electrode part 10 is an electrode on the positive terminal side. It should be noted that a backside electrode having ohmic contact with the n-InP substrate is disposed on the rear surface of the modulator integrated semiconductor laser element 2, and becomes an electrode on the negative terminal side of the EA modulator 6.

The pad parts 10b of the p electrode parts 10 in the respective two EA modulators 6 (EA1, EA2) adjacent to each other on the optical signal path are disposed on the respective sides opposite to each other about the optical signal path. Thus, the reduction of the self-inductance of the p electrode parts 10 of the EA modulators EA1, EA2 can be achieved.

Figure 2:
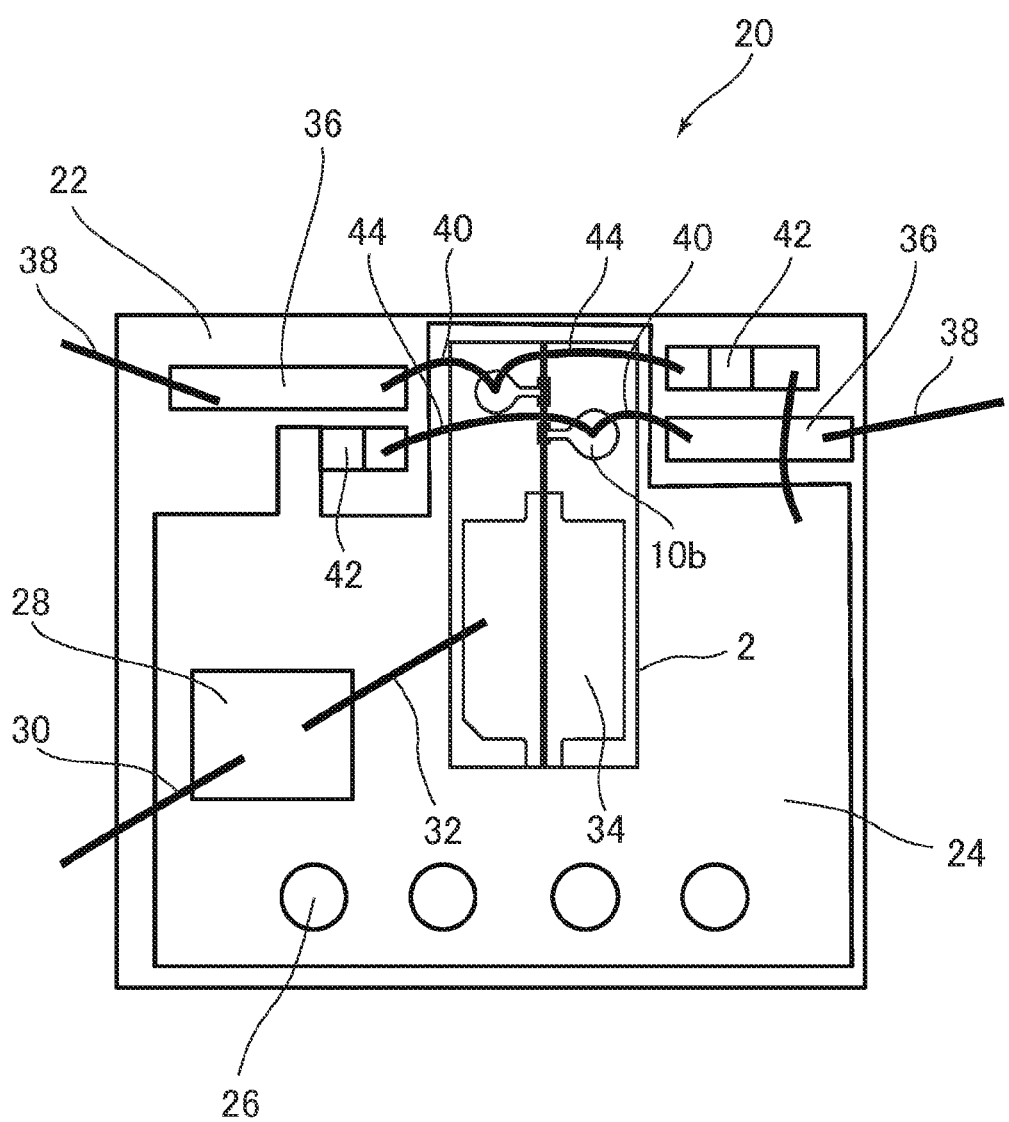
FIG. 2 is a schematic plan view of an optical device according to the first embodiment of the invention.

FIG. 2 is a schematic plan view showing an optical device 20 having the modulator integrated semiconductor laser element 2 mounted on a chip carrier 22.

The modulator integrated semiconductor laser element 2 is disposed on a ground electrode 24 formed on an upper surface of the chip carrier 22, and the backside electrode of the modulator integrated semiconductor laser element 2 and the ground electrode 24 of the chip carrier 22 are electrically connected to each other. It should be noted that the ground electrode 24 is connected to an electrode located on the rear surface side of the chip carrier 22 via via holes 26.

Further, a chip capacitor 28 is also mounted on the ground electrode 24 as a bypass capacitor. In the DFB laser part 4, a laser diode is supplied with a forward DC current $I_{bias}$ via wires 30, 32 and a p electrode part 34 from an external laser driver (not shown), and a laser beam is continuously output. The bypass capacitor is connected between signal lines (the wires 30, 32) and the ground electrode 24 in parallel to the laser diode to remove a noise component which can be included in the DC current $I_{bias}$.

Each of the EA modulators 6 is supplied with a drive signal, which has a voltage switched at a high frequency corresponding to the modulation signal, from the modulator driver located outside. On the chip carrier 22, there are formed high-frequency lines 36 corresponding respectively to the EA modulators, and the drive signals are transmitted to the high-frequency lines 36 from the modulator drivers located outside the chip carrier 22 via wires 38, and are then applied to the pad parts 10b via wires 40, respectively.

On the chip carrier 22, there are formed terminating resistors 42 of the respective EA modulators EA1, EA2 using thin film resistors. One ends of the terminating resistors 42 are connected to the ground electrode 24, and the other ends are connected to the pad parts 10b via wires 44, respectively.

As described above, the pad parts 10b of the EA modulators EA1, EA2 are disposed on the respective sides opposite to each other about the mesa stripe part as the optical signal path. Further, the high-frequency line 36 for the respective EA modulators EA1 and the high-frequency line 36 for the respective EA modulators EA2 are also disposed on the respective sides opposite to each other about the mesa stripe part, and the terminating resistors 42 for the respective EA modulators EA1 and terminating resistors 42 for the respective EA modulators EA2 are also disposed on the respective sides opposite to each other about the mesa stripe part. Therefore, in FIG. 2, with respect to the EA modulator EA1, the wire 40 extends to the pad part 10b from the high-frequency line 36 disposed on the right side, and the wire 44 extends to the terminating resistor 42 disposed on the left side from the pad part 10b. In contrast, with respect to the EA modulator EA2, the wire 40 extends to the pad part 10b from the high-frequency line 36 disposed on the left side, and the wire 44 extends to the terminating resistor 42 disposed on the right side from the pad part 10b. Therefore, the direction of the current flowing through the signal line for the EA modulator (6) is reversed between EA1 and EA2. Thus, the direction of the voltage induced in the signal line is reversed between the two EA modulators EA1, EA2, and thus, the fluctuations of the extinction ratio of the respective EA modulators 6 are canceled out. Therefore, the reduction of the noise in the output light $S_{OUT}$ of the modulator integrated semiconductor laser element 2 can be achieved.

Figure 3:
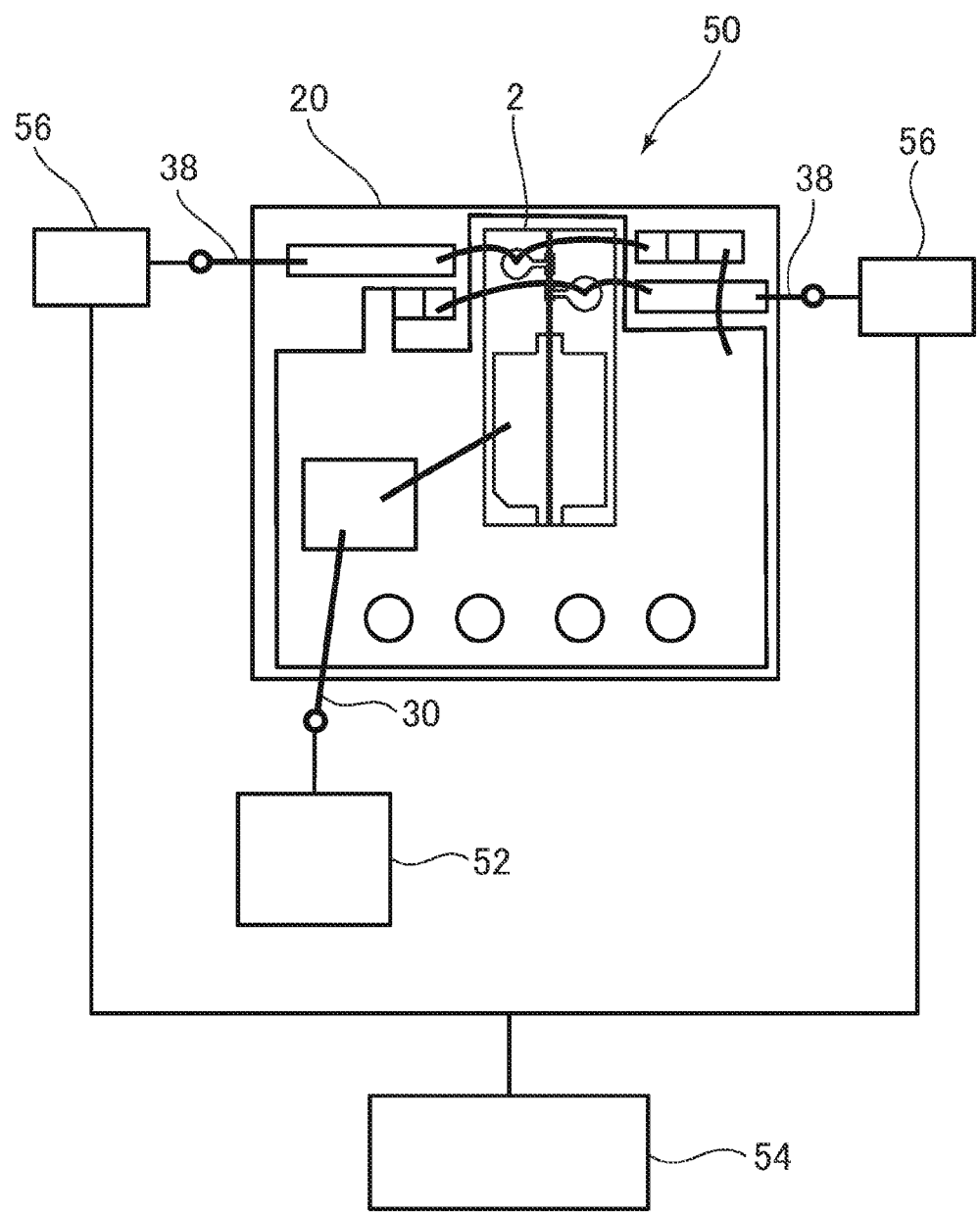
FIG. 3 is a schematic diagram of an optical transmitter module according to the first embodiment of the invention.

FIG. 3 is a schematic diagram of an optical transmitter module 50 as the optical signal generator according to the present embodiment. The optical transmitter module 50 includes the optical device 20, a laser driver 52, a modulation signal generation device 54, and modulator drivers 56.

The laser driver 52 generates the DC current $I_{bias}$ to supply the DFB laser part 4 with the DC current $I_{bias}$.

The modulation signal generation device 54 and the modulator drivers 56 constitute the modulation part together with the EA modulators 6.

The modulator drivers 56 are disposed corresponding respectively to the EA modulators 6, and generate the applied voltages to the respective EA modulators 6. The modulator drivers 56 for the two EA modulators 6 are the circuits electrically independent of each other on the one hand, and have the circuit configuration basically common to each other to drive the EA modulators 6 in the drive conditions common to each other on the other hand. Specifically, the voltage applied when the EA modulators EA1, EA2 are in the ON state is common to the modulator drivers, and the voltage applied when the EA modulators EA1, EA2 are in the OFF state is common to the modulator drivers. Specifically, the offset voltage (typically a negative value) common to the modulator drivers is applied when the EA modulators EA1, EA2 are in the OFF state, and the modulation signal common to the modulator drivers is applied with the same amplitude during the ON state.

The modulation signal generation device 54 internally generates the modulation signal, or inputs the modulation signal from the outside, and then generates binary control signals for controlling ON/OFF of the modulator drivers 56 from the modulation signal. Here, the modulation signal generation device 54 generates a single control signal, and then supplies the control signal to the two modulator drivers 56 in common. The modulator drivers 56 perform operations common to each other based on the control signal common to each other. Thus, the two EA modulators 6 are switched between the ON state and the OFF state in sync with each other. In other words, the EA modulators EA1, EA2 are set to the ON state at the same time, and are set to the OFF state at the same time to thereby generate the modulated optical signal, which is a binary signal, as the output light $S_{OUT}$.

In order to provide the modulator drivers 56 for the two EA modulators 6 with the same configuration, the EA modulators EA1, EA2 are configured so that the electrical characteristics viewed from the modulator drivers 56 are the same or substantially the same as each other. The difference in electrical characteristics generated between the EA modulators 6 includes the influence of the impedance fluctuation corresponding to the photocurrent in the EA modulators 6 described above. The photocurrent depends on the modulator length. Therefore, by adjusting the modulator length of each of the EA modulators 6, homogenization of the electrical characteristics including the impedance between the EA modulators 6 is attempted. In this regard, the specific values of the modulator lengths $L_1$, $L_2$ satisfying $L_1<L_2$ described above are determined.

It should be noted that if the modulator length is changed for the impedance adjustment, other electrical characteristics of the EA modulator 6 such as the capacitance of the contact part 10a of the p electrode part 10 can be changed. In the case of adjusting the difference in such other electrical characteristics between the EA modulators 6 using another method, or in the case in which an approximation of neglecting the difference is allowed, the specific values of the modulator lengths $L_1$, $L_2$ can be determined basically based on the photocurrent in each of the EA modulators 6. Specifically, it is sufficient to design the modulator lengths $L_1$, $L_2$ so that the optical absorptions in the respective EA modulators 6 become equal to each other.

For example, the difference in the capacitance between the contact parts 10a due to the change of the modulator length can be adjusted by the areas of the pad parts 10b. Specifically, the pad parts 10b of the respective EA modulators 6 are made so that the shorter the modulator length of the EA modulator 6 is, the larger area the pad part 10b has.

Further, in the case in which, for example, the photocurrent becomes high due to the fact that the intensity of the input light to the EA modulator 6 is high, the difference in impedance can be more conspicuous than differences in other factors in the differences in electrical characteristics due to the modulator lengths. In such a case, only the equalization of the impedance between the EA modulators 6 can approximately be performed as the equalization of the electrical characteristics described above.

Although in the embodiment described above there is described the example in which the number of the EA modulators 6 serially arranged in the optical signal path is two, the number of the EA modulators 6 can be equal to or larger than three. Specifically, in the configuration in which the M EA modulators EAk (k=1, 2, ..., M) are serially arranged in sequence from the light source side assuming M as a natural number equal to or larger than three, the modulator lengths $L_k$ are set so as to fulfill $L_1<L_2<\ldots<L_M$, and the specific values of the modulator lengths $L_k$ are determined so that the equalization of the electrical characteristics between the EA modulators 6 described above can be achieved.

In the optical transmitter module 50, by dividing the electrode of the EA modulator to form a plurality of EA modulators, and driving the EA modulators by the respective modulator drivers, both of the modulation bandwidth and the extinction ratio can be ensured. In other words, by providing a plurality of EA modulators, the modulator length of each of the EA modulators is shortened to decrease the capacitance of each of the EA modulators to thereby achieve the broader bandwidth. On the other hand, regarding the drop of the extinction ratio caused by the tradeoff with the broader bandwidth, compensation thereof can be achieved by providing the plurality of EA modulators. Further, by adjusting the modulator length of each of the EA modulators, the circuit configuration of the plurality of modulator drivers is made common to each other, and thus, reduction in the load on the circuit design, reduction in man-hour and cost of circuit production can be achieved.

Second Embodiment

An optical transmitter module as the optical signal generator according to the second embodiment of the invention will hereinafter be described with a focus on a different point from the first embodiment described above attaching the same reference symbols to the common constituents to the first embodiment and the present embodiment, and basically omitting the description of the common constituents.

Figure 4:
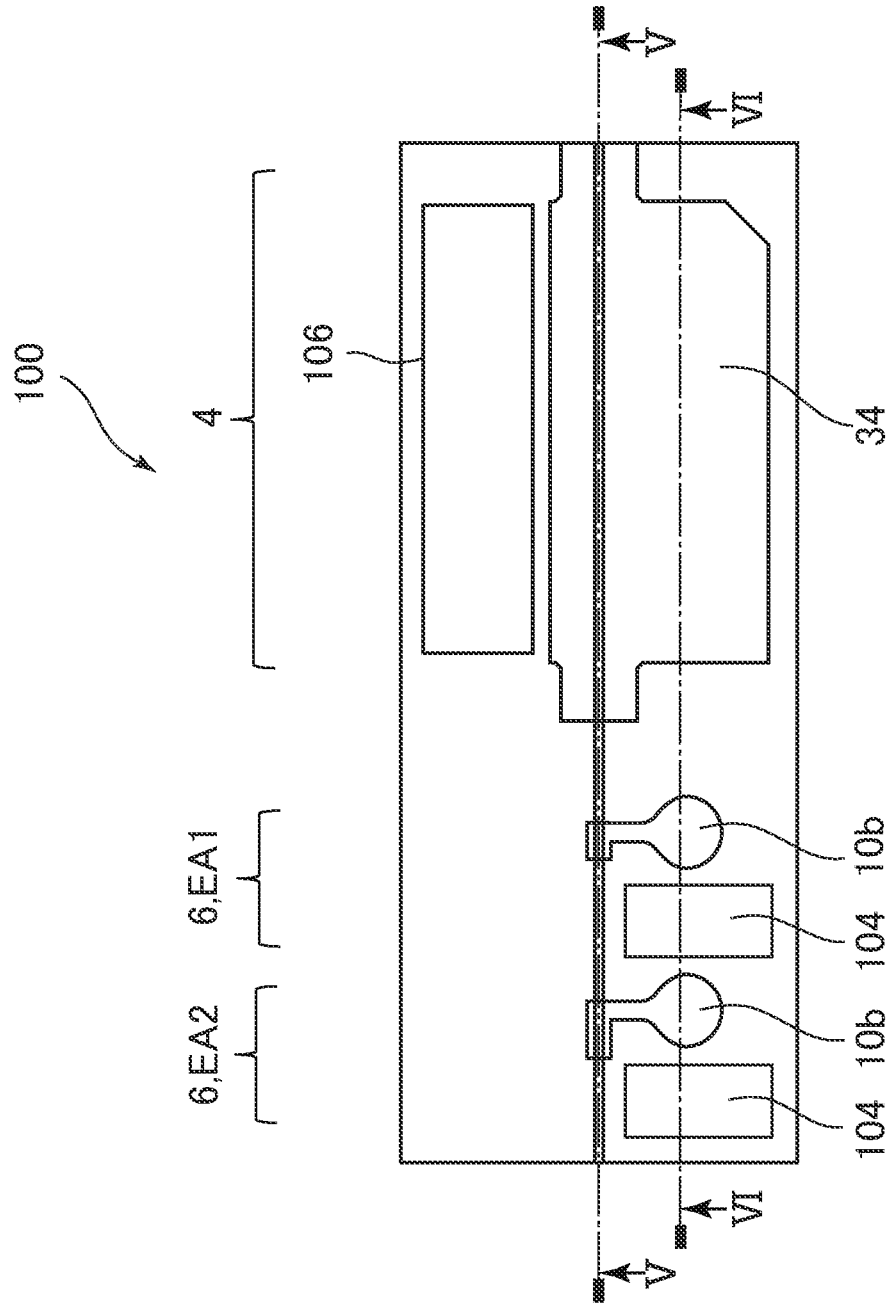
FIG. 4 is a schematic plan view of a modulator integrated semiconductor laser element according to a second embodiment of the invention.
Figure 5:
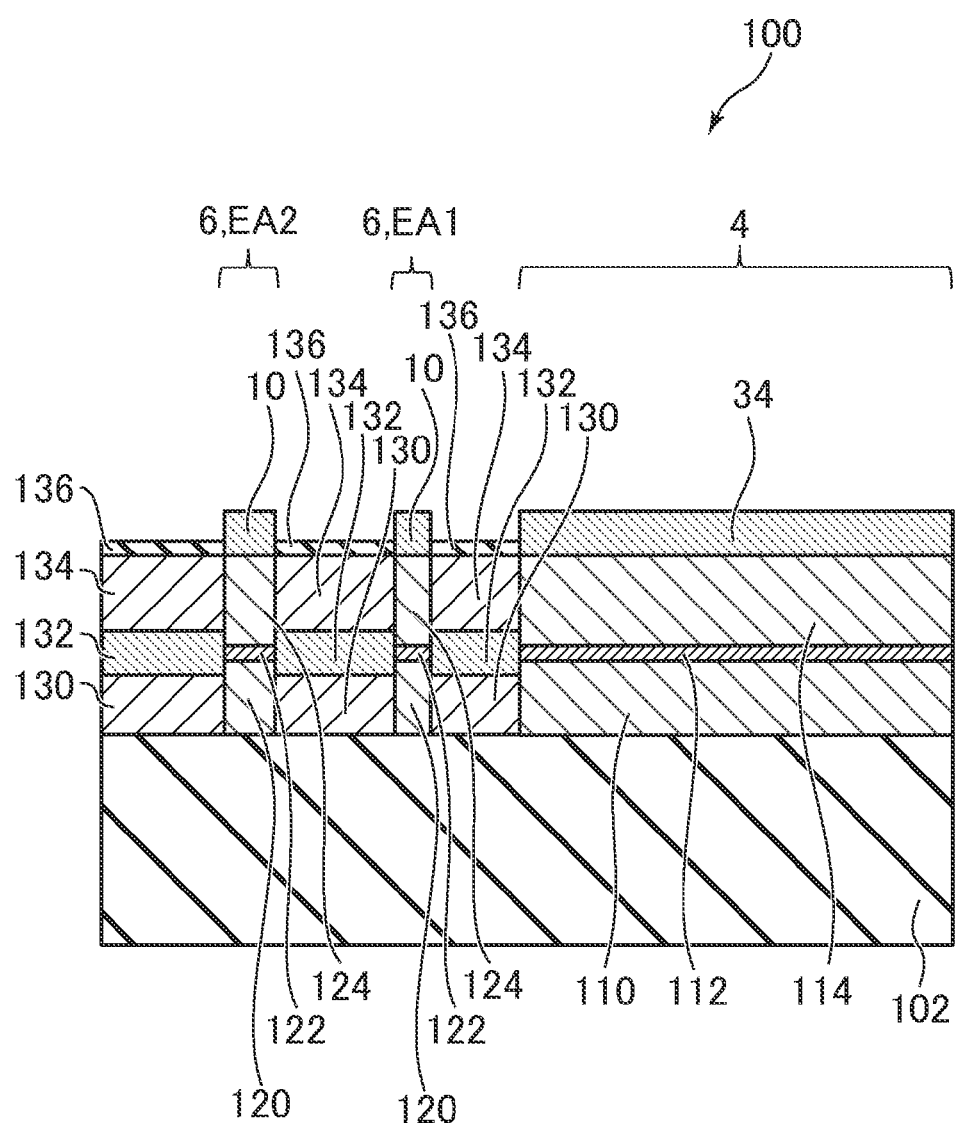
FIG. 5 is a schematic vertical cross-sectional view of the modulator integrated semiconductor laser element according to the second embodiment of the invention along the line V-V shown in FIG. 4.
Figure 6:
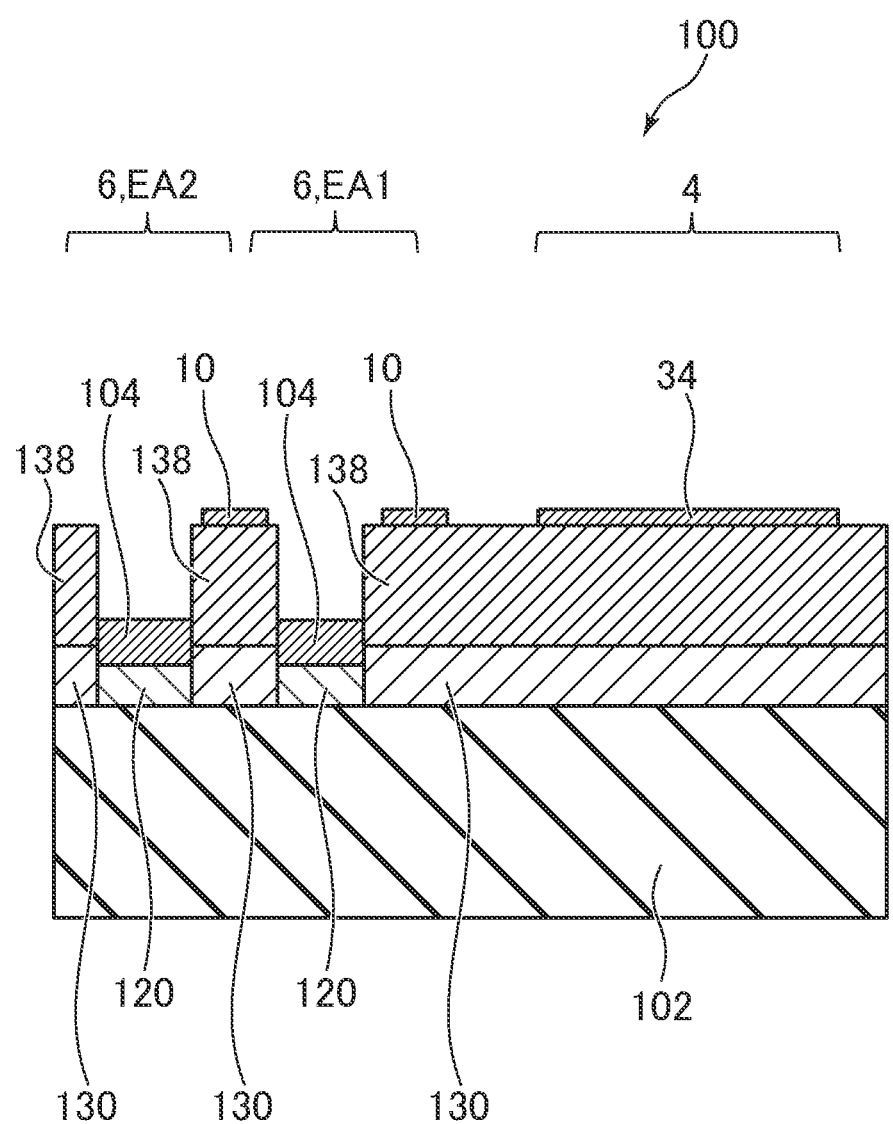
FIG. 6 is a schematic vertical cross-sectional view of the modulator integrated semiconductor laser element according to the second embodiment of the invention along the line VI-VI shown in FIG. 4.

The optical transmitter module according to the present embodiment is configured using a modulator integrated semiconductor laser element 100 instead of the modulator integrated semiconductor laser element 2 according to the first embodiment. FIG. 4 is a schematic plan view of the modulator integrated semiconductor laser element 100. FIG. 5 is a schematic vertical cross-sectional view along the line V-V shown in FIG. 4, FIG. 6 is a schematic vertical cross-sectional view along the line VI-VI shown in FIG. 4.

The modulator integrated semiconductor laser element 100 is formed on a semi-insulating InP substrate 102, and positive and negative driving electrode pads for connecting interconnections for supplying the EA modulators 6 and the DFB laser part 4 with the drive voltages are both disposed on a principal surface on an opposite side to the semi-insulating InP substrate 102 of the modulator integrated semiconductor laser element 100. Specifically, on the upper surface of the modulator integrated semiconductor laser element 100, there are disposed n electrode parts 104 of the EA modulators 6 and an n electrode part 106 of the DFB laser part 4 in addition to the p electrode parts 10 of the EA modulators 6 and the p electrode part 34 of the DFB laser part 4 already described as the driving electrode pads. Here, the p electrode parts 10, 34 are defined as positive terminals, and the n electrode parts 104, 106 are defined as negative terminals. The n electrode parts 104 of the respective EA modulators 6 are disposed on the same side as the pad parts 10b of the p electrode parts 10 viewed from the mesa stripe.

FIG. 5 shows a vertical cross-sectional structure of the modulator integrated semiconductor laser element 100 along the mesa stripe. In the DFB laser part 4, an n-InP layer 110, an MQW active layer 112, a p-InP layer 114, and the p electrode part 34 are stacked in sequence on the semi-insulating InP substrate 102.

Further, in the part corresponding to the EA modulator 6, an n-InP layer 120, an MQW active layer 122, a p-InP layer 124, and the p electrode part 10 are stacked in sequence on the semi-insulating InP substrate 102.

In the part corresponding to the waveguide 8, a lower-side undoped InP layer 130, a waveguide layer 132, an upper-side undoped InP layer 134, and an insulating film 136 are stacked in sequence on the semi-insulating InP substrate 102.

FIG. 6 shows a vertical cross-sectional structure of the modulator integrated semiconductor laser element 100 along the line VI-VI passing through the n electrode parts 104 and parallel to the mesa stripe. In the part other than the n electrode parts 104, the lower undoped InP layer 130 and the high resistance InP layer 138 are stacked in sequence on the semi-insulating InP substrate 102. On the high resistance InP layer 138, the p electrode part 34 of the DFB laser part 4 and the p electrode parts 10 of the EA modulators 6 are further stacked.

In the places where the n electrode parts 104 are formed, the n-InP layer 120 disposed in common with the mesa stripe part is stacked on the semi-insulating InP substrate 102. The n-InP layer 120 is exposed by forming openings in the high resistance InP layer 138 stacked on the n-InP layer 120, and the n electrode parts 104 are stacked on the n-InP layer 120 thus exposed.

In the modulator integrated semiconductor laser element 100, by forming the EA modulators 6 and the DFB laser part 4 on the semi-insulating substrate, the capacitance of the driving electrode pads can be reduced. For example, in the element using the n-InP substrate, the entire substrate becomes the negative terminal on the one hand, and the area of the negative terminal can be reduced to achieve the reduction of capacitance in the modulator integrated semiconductor laser element 100, on the other hand.

Figure 7:
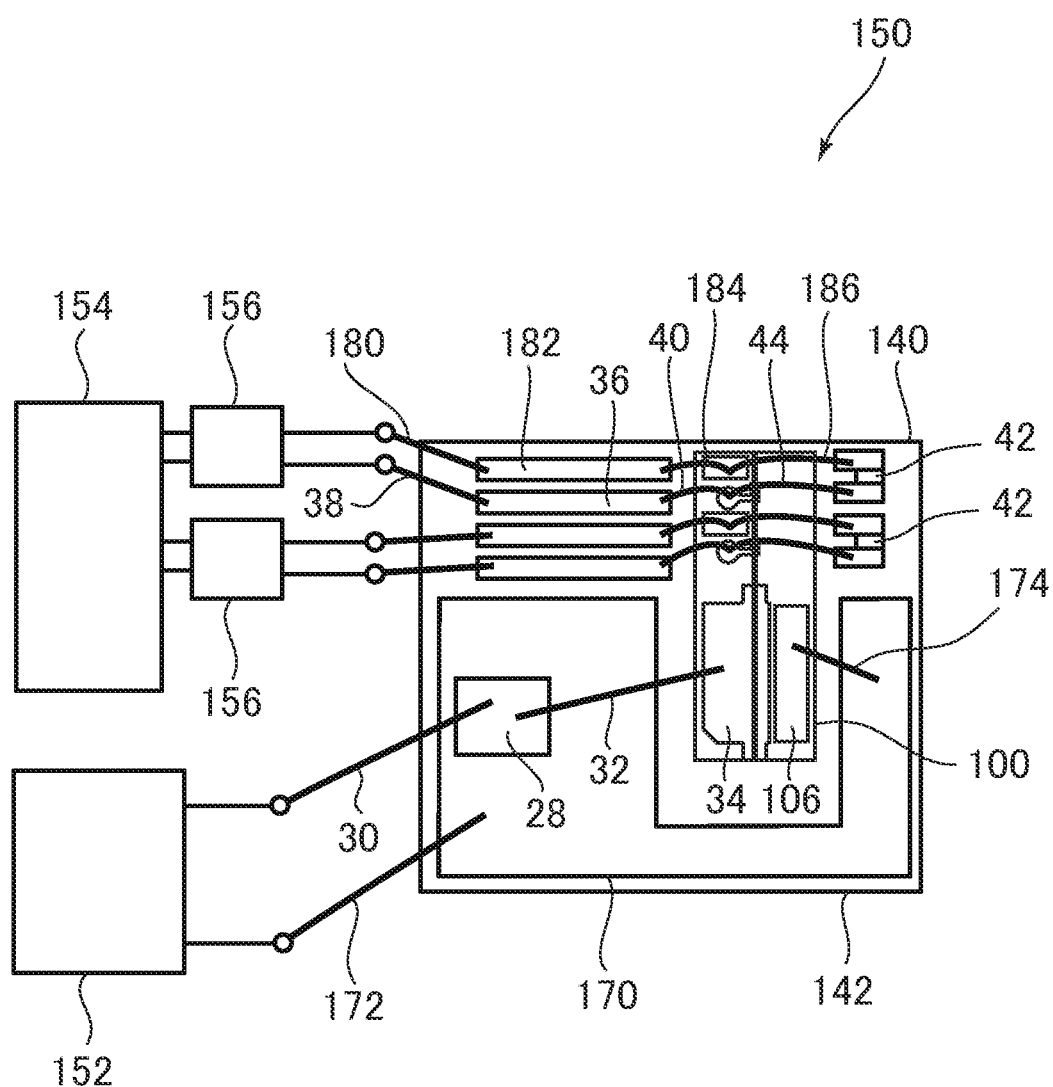
FIG. 7 is a schematic diagram of an optical transmitter module according to the second embodiment of the invention.

FIG. 7 is a schematic diagram of an optical transmitter module 150 configured using the modulator integrated semiconductor laser element 100. The optical transmitter module 150 includes an optical device 140, a laser driver 152, a modulation signal generation device 154, and modulator drivers 156. The optical device 140 includes the modulator integrated semiconductor laser element 100, the terminating resistors 42, the chip capacitor 28, and so on.

In the modulator integrated semiconductor laser element 2 according to the first embodiment, the negative terminals of the DFB laser part 4 and the EA modulators 6 are connected by the n-InP substrate. Therefore, the drive signal is basically a single-ended signal applied only to the positive terminal. In contrast, since in the modulator integrated semiconductor laser element 100, the negative terminals of the EA modulators 6 and the DFB laser part 4 are formed separately from each other, it is possible to achieve the differential signal drive. The optical transmitter module 150 is different from the optical transmitter module 50 in the point that the differential signal drive is adopted.

Specifically, the laser driver 152 and the modulator drivers 156 each output the differential signal. Further, in the optical device 140, the path of the reversed-phase signal is separately provided for each of the differential signals. For example, an electrode 170 is formed on the upper surface of the chip carrier 142 of the optical device 140 so as to correspond to the reversed-phase signal of the laser driver 152, and the chip capacitor 28 is mounted on the electrode 170. The normal phase terminal of the laser driver 152 is connected to the p electrode part 34 of the DFB laser part 4 of the modulator integrated semiconductor laser element 100 via the wire 30, the electrode of the chip capacitor 28, and the wire 32, and the reversed-phase terminal is connected to the n electrode part 106 of the DFB laser part 4 via a wire 172, the electrode 170, and a wire 174. The normal phase terminal of each of the modulator drivers 156 is connected to the p electrode part 10 of the EA modulator 6 via the wire 38, the high-frequency line 36, and the wire 40, and the reversed-phase terminal is connected to the n electrode part 104 of the EA modulator 6 via a wire 180, a high-frequency line 182, and a wire 184. It should be noted that one ends of the terminating resistors 42 each formed of the thin film resistor are connected to the p electrode parts 10 via the wires 44, and the other ends are connected to the n electrode parts 104 via the wires 186, respectively.

Except the difference in the transmission system of the signal, namely between the single-ended signals and the differential signals, the laser driver 152, the modulation signal generation device 154, and the modulator drivers 156 function basically similarly to the laser driver 52, the modulation signal generation device 54, and the modulator drivers 56 of the first embodiment.

The plurality of modulator drivers 156 of the optical transmitter module 150 can have the circuit configuration in common similarly to the modulator drivers 56 of the optical transmitter module 50 of the first embodiment, and thus, the optical transmitter module 150 has substantially the same advantages as described in the first embodiment.

Further, as described above, the pad parts 10b of the p electrode parts 10 and the n electrode parts 104 of the respective EA modulators 6 are disposed on the same side viewed from the mesa stripe. Thus, it is possible to dispose the modulator integrated semiconductor laser element 100 on the chip carrier 142 so that the p electrode parts 10 and the n electrode parts 104 are both located closer to the high-frequency lines 36, 182, respectively. As a result, the wire length of each of the wires 40, 184 for inputting the drive signals is shortened, and thus, the bandwidth to the drive signals can further be improved in addition to the effect due to the electrode division of the EA modulator.

Third Embodiment

An optical transmitter module as the optical signal generator according to the third embodiment of the invention will hereinafter be described with a focus on a different point from the first and second embodiments described above attaching the same reference symbols to the common constituents to the embodiments described above and the present embodiment, and basically omitting the description of the common constituents.

Figure 8:
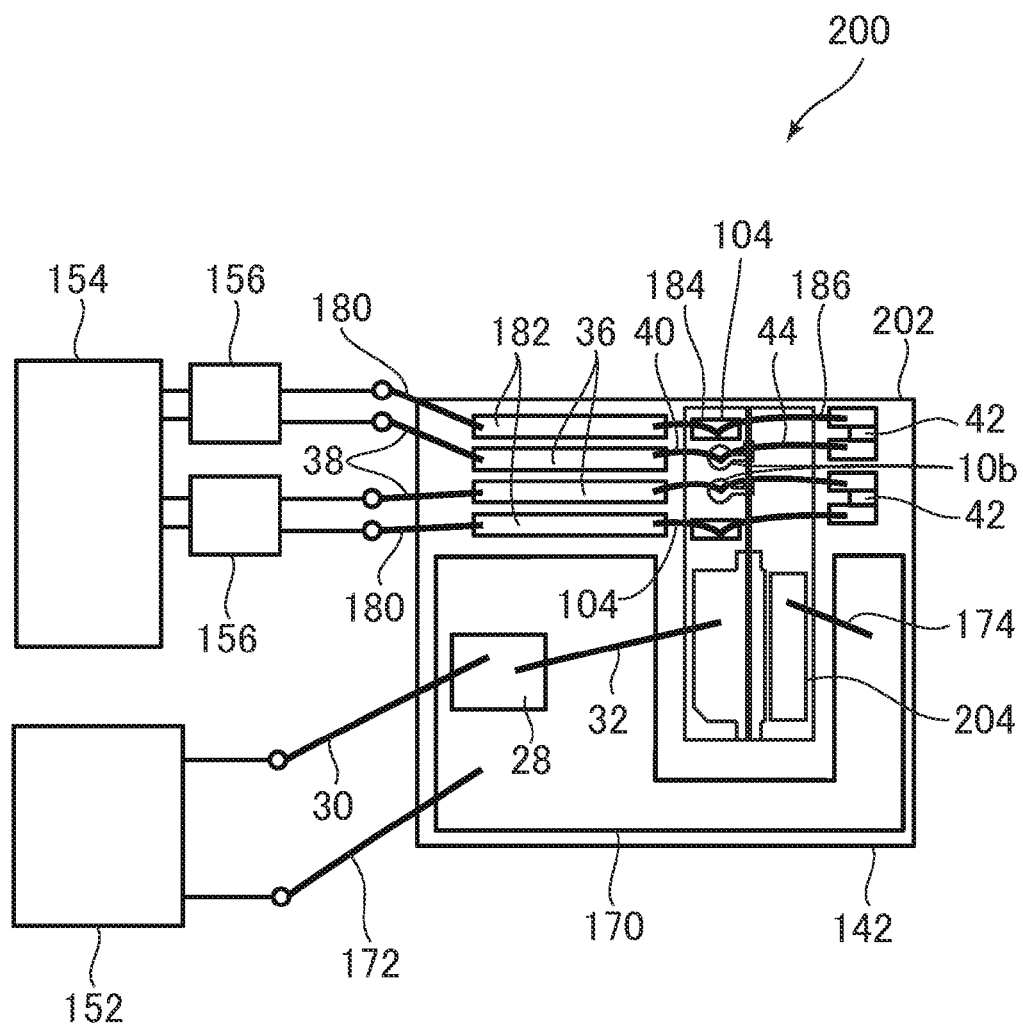
FIG. 8 is a schematic diagram of an optical transmitter module according to a third embodiment of the invention.

FIG. 8 is a schematic diagram of the optical transmitter module 200 according to the present embodiment. Similarly to the modulator integrated semiconductor laser element 100 used in the optical transmitter module 150 according to the second embodiment, in a modulator integrated semiconductor laser element 204 installed in an optical device 202 of the optical transmitter module 200, the p electrode parts 10 and the n electrode parts 104 of the EA modulators 6 and the p electrode part 34 and the n electrode part 106 of the DFB laser part 4 are disposed on the principal surface on the opposite side to the semi-insulating InP substrate 102. Further, the fact that the pad parts 10b of the p electrode parts 10 and the n electrode parts 104 are disposed on the same side viewed from the mesa stripe is also common to the modulator integrated semiconductor laser element 204 and the modulator integrated semiconductor laser element 100.

In contrast, the order of the arrangement of the pad parts 10b of the p electrode parts 10 and the n electrode parts 104 in the direction of the optical signal path is different between the modulator integrated semiconductor laser element 204 and the modulator integrated semiconductor laser element 100. Specifically, in the modulator integrated semiconductor laser element 204, the order of the arrangement of the pad part 10b and the n electrode part 104 is reversed between the EA modulators 6 adjacent to each other on the optical signal path. Specifically, in the example shown in FIG. 8, regarding the EA modulator EA1, the n electrode part 104 and the pad part 10b are arranged in sequence in a direction getting away from the DFB laser part 4, and in contrast, regarding the EA modulator EA2, the pad part 10b and the n electrode part 104 are arranged in sequence in a direction getting away from the DFB laser part 4.

Thus, the direction of the current flowing through the signal line with respect to the EA modulator 6 is reversed between the EA modulators EA1, EA2, and in the optical transmitter module 200, the advantage that the noise caused by the external electromagnetic field can be reduced can be obtained similarly to the first embodiment.

It should be noted that it is possible for the plurality of modulator drivers 156 to have the circuit configuration in common similarly to the second embodiment, and thus, the optical transmitter module 200 has substantially the same advantages as in the optical transmitter modules according to the first and second embodiments.

Fourth Embodiment

An optical transmitter module as the optical signal generator according to the fourth embodiment of the invention will hereinafter be described with a focus on a different point from the embodiments described above attaching the same reference symbols to the common constituents to the embodiments described above and the present embodiment, and basically omitting the description of the common constituents.

Figure 9:
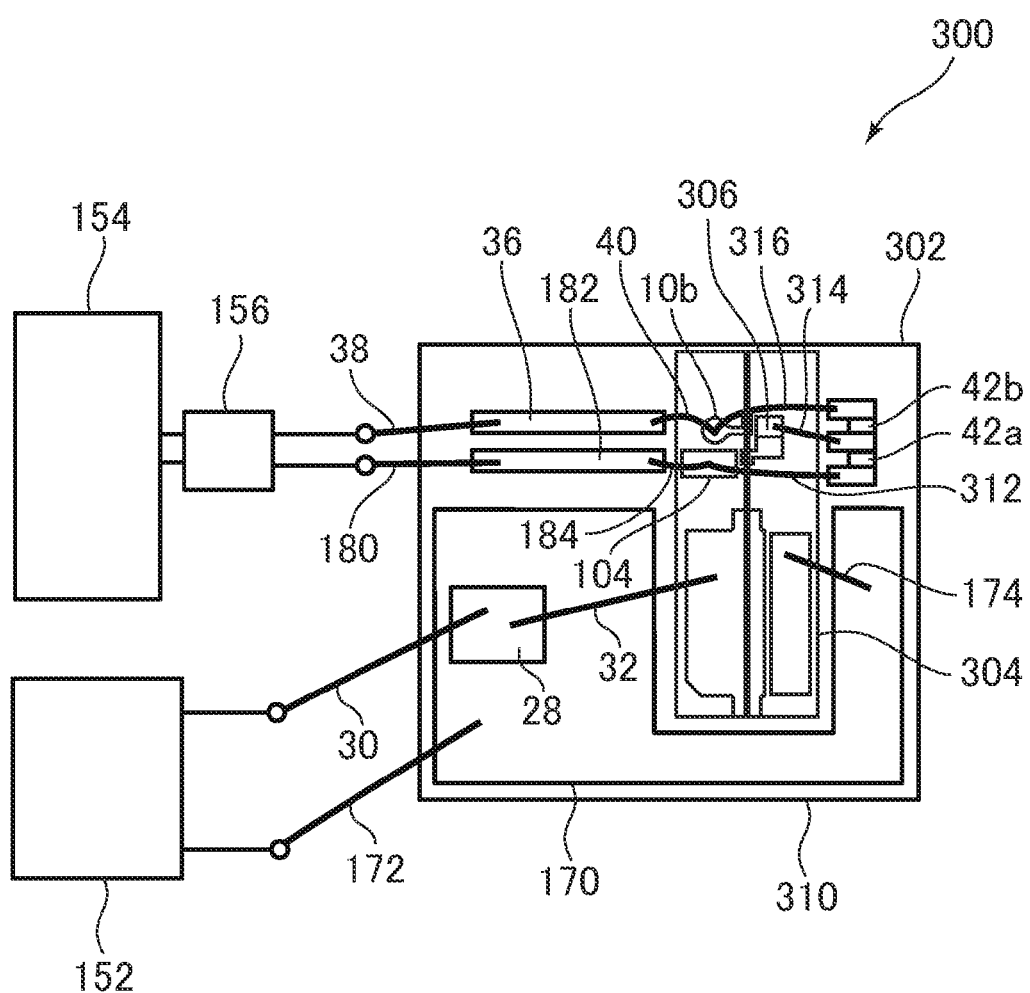
FIG. 9 is a schematic diagram of an optical transmitter module according to a fourth embodiment of the invention.

FIG. 9 is a schematic diagram of the optical transmitter module 300 according to the present embodiment. The optical transmitter module 300 has a single modulator driver 156, and the plurality of EA modulators 6 provided to a modulator integrated semiconductor laser element 304 installed in an optical device 302 is electrically connected in series to each other to the modulator driver 156.

In the modulator integrated semiconductor laser element 304, the p electrode part 10 and the n electrode part 104 of the EA modulators 6, and the p electrode part 34 and the n electrode part 106 of the DFB laser part 4 are disposed on a principal surface on the opposite side to the semi-insulating InP substrate 102 similarly to the modulator integrated semiconductor laser elements 100, 204 according to the second and third embodiments. On the obverse surface of the modulator integrated semiconductor laser element 304, the pad part 10b of the p electrode part 10 of the EA modulator EA2, the n electrode part 104 of the EA modulator EA1, and an electrode 306 are disposed as the driving electrode pads for the EA modulators EA1, EA2. The electrode 306 is an electrode obtained by connecting the p electrode part 10 of the EA modulator EA1 and the n electrode part 104 of the EA modulator EA2 to each other, and thus, the EA modulators EA1, EA2 are electrically connected in series to each other.

Further, one of the terminals of the differential output of the modulator driver 156 is connected to the pad part 10b of the EA modulator EA2 via the wire 38, the high-frequency line 36, and the wire 40, and the other of the terminals is connected to the n electrode part 104 of the EA modulator EA1 via the wire 180, the high-frequency line 182, and the wire 184.

In the present embodiment, the electrode of the EA modulator is divided to form the plurality of EA modulators, and these EA modulators are serially connected to the single modulator driver 156. Therefore, since the capacitive load due to the plurality of EA modulators is not connected in parallel to the modulator driver 156, an improvement in the modulation band characteristics is achieved, and thus, it becomes possible to assure both of the modulation bandwidth and the extinction ratio. Further, since the plurality of EA modulators is driven by the single modulator driver, reduction in the load on the circuit design, reduction in man-hour and cost of circuit production can be achieved compared to the case of providing a plurality of modulator drivers having respective configurations different from each other.

An electrical resistance is connected in parallel to each of the EA modulators 6 connected in series to each other in the optical transmitter module 300. Specifically, on the chip carrier 310, there are formed the two terminating resistors 42a, 42b so as to correspond respectively to the EA modulators EA1, EA2. Both of the edges of the terminating resistor 42a are connected to the n electrode part 104 of the EA modulator EA1 and the electrode 306 by wires 312, 314, respectively. In other words, the terminating resistor 42a is connected in parallel to the EA modulator EA1 Further, both of the edges of the terminating resistor 42b are connected to the electrode 306 and the pad part 10b of the EA modulator EA2 by the wire 314 and wire 316, respectively. In other words, the terminating resistor 42b is connected in parallel to the EA modulator EA2.

One of the terminals of the differential output of the modulator driver 156 is connected to the pad part 10b of the EA modulator EA2 via the wire 38, the high-frequency line 36, and the wire 40, and the other of the terminals is connected to the n electrode part 104 of the EA modulator EA1 via the wire 180, the high-frequency line 182, and the wire 184. The drive voltage output from the modulator driver 156 is divided in accordance with the resistance values of the terminating resistors 42a, 42b. Therefore, the applied voltage to each of the EA modulators 6, and by extension the extinction ratio of each of the EA modulators 6, are determined in accordance with the resistance values of the terminating resistors 42a, 42b.

For example, in the case in which the resistance values of the terminating resistors 42a, 42b are the same, the applied voltages of the EA modulators EA1, EA2 become roughly the same, and roughly the same advantages as in the first embodiment can be obtained with a single driver.

Fifth Embodiment

An optical transmitter module as the optical signal generator according to the fifth embodiment of the invention will hereinafter be described with a focus on a different point from the embodiments described above attaching the same reference symbols to the common constituents to the embodiments described above and the present embodiment, and basically omitting the description of the common constituents.

Figure 10:
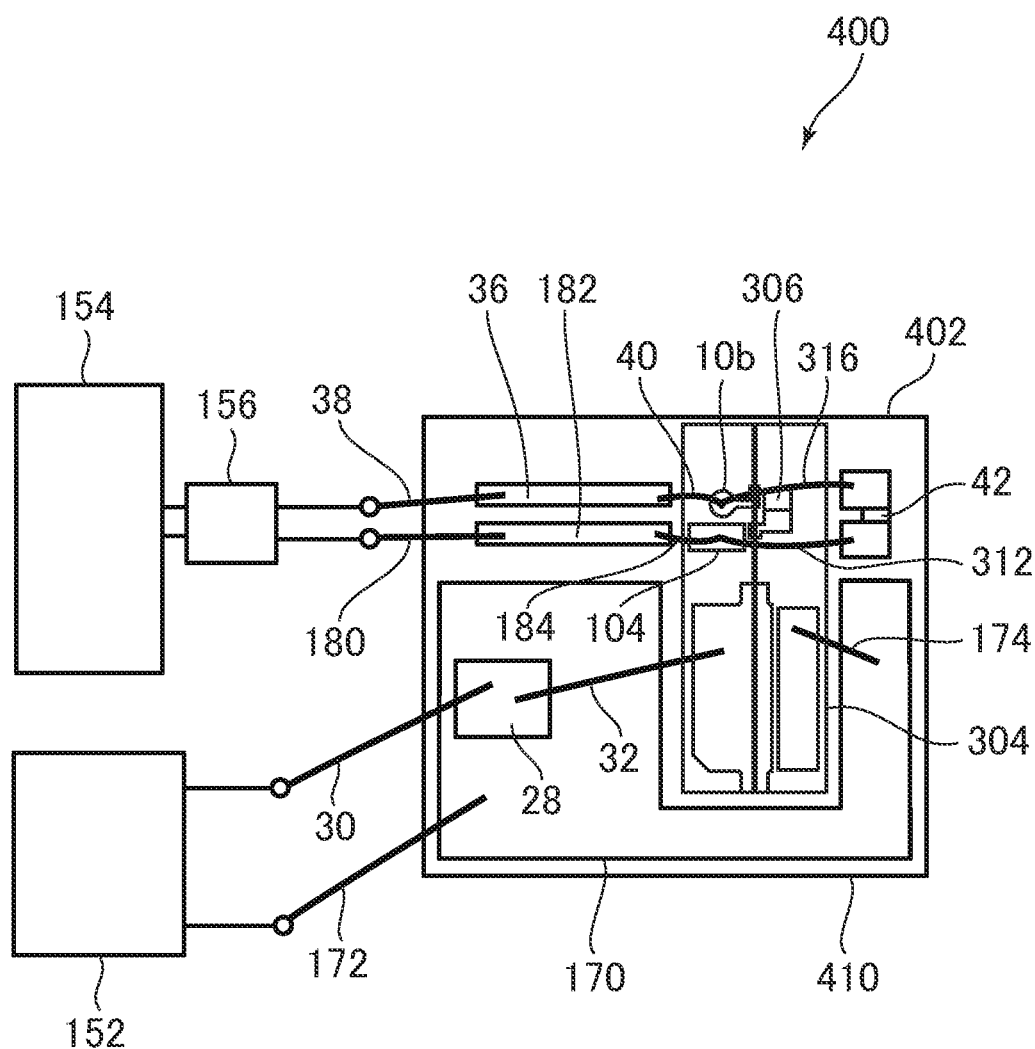
FIG. 10 is a schematic diagram of an optical transmitter module according to a fifth embodiment of the invention.

FIG. 10 is a schematic diagram of the optical transmitter module 400 according to the present embodiment. The point, in which the optical transmitter module 400 is different from the optical transmitter module 300 according to the fourth embodiment, is a point that an electrical resistance is connected to the modulator driver 156 in parallel to the plurality of EA modulators 6 connected in series to each other and provided to the modulator integrated semiconductor laser element 304 implemented in an optical device 402. In other words, in the present embodiment, the terminating resistor 42 is not connected in parallel to each of the EA modulators 6, but is connected in parallel to the whole of the EA modulators 6 connected in series to each other.

Specifically, among the constituents of the optical transmitter module 400, the constituent in which the optical transmitter module 400 is different from the optical transmitter module 300 is a chip carrier 410, and a single terminating resistor 42 is formed on the chip carrier 410. The modulator integrated semiconductor laser element 304 has basically the same configuration as in the fourth embodiment. One of the terminals of the terminating resistor 42 is connected to the n electrode part 104 of the EA modulator EA1 of the modulator integrated semiconductor laser element 304 via the wire 312, and the other of the terminals is connected to the pad part 10b of the EA modulator EA2 via the wire 316.

Similarly to the fourth embodiment, in the present embodiment, the advantage of the reduction in the load on the circuit design and so on due to driving of the plurality of EA modulators with the single modulator driver can be obtained while achieving the assurance of both of the modulation bandwidth and the extinction ratio.

It should be noted that since in the present embodiment, the EA modulators EA1, EA2 are connected in series to each other, the current flowing through these components is common to these components. In other words, the optical absorptions in the respective EA modulators 6 become basically the same in amount as each other.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical signal generator to modulate an intensity of an input optical signal from a light source, the optical signal generator comprising:
 a modulation part that modulates the intensity of the input optical signal and generates a modulated optical signal, wherein the modulation part includes:
  a plurality of electro-absorption optical modulators disposed in series in an optical signal path of the input optical signal, and which each absorb light in accordance with an applied voltage, and
  a plurality of drive circuits disposed so as to correspond respectively to the plurality of electro-absorption optical modulators, and which generate and supply the electro-absorption optical modulators with the applied voltage in common, in accordance with a control signal,
 wherein respective modulator lengths of the plurality of electro-absorption optical modulators are set so that the closer to the light source the electro-absorption optical modulator is, the shorter the modulator length is set.

2. The optical signal generator according to claim 1, wherein
 the modulator lengths of the plurality of electro-absorption optical modulators are set so that optical absorptions in the respective electro-absorption optical modulators become equal to each other.

3. The optical signal generator according to claim 1, further comprising:
 an optical semiconductor element which includes the electro-absorption optical modulators and a plurality of electrode pads, to which a plurality of wires for supplying the applied voltage are connected, with respect to at least one of polarities, namely a positive terminal and a negative terminal, of the electro-absorption optical modulators, the electrode pads being disposed on a surface of the optical semiconductor element, and
 wherein the electrode pads of a same polarity in two of the electro-absorption optical modulators adjacent to each other in the optical signal path are disposed on respective sides opposite to each other about the optical signal path.

4. The optical signal generator according to claim 1, further comprising:
 an optical semiconductor element which includes the electro-absorption optical modulators and a plurality of electrode pads, to which a plurality of wires for supplying the applied voltage are connected, with respect to a plurality of positive terminals and a plurality of negative terminals of the electro-absorption optical modulators, the electrode pads being disposed on a surface of the optical semiconductor element, and
 an order of arrangement in a direction of the optical signal path related to the electrode pads of the positive terminals and the negative terminals of each of the electro-absorption optical modulators is reversed between two of the electro-absorption optical modulators adjacent to each other on the optical signal path.

5. An optical signal generator to modulate an intensity of an input optical signal from a light source, the optical signal generator comprising:
 a modulation part that modulates the intensity of the input optical signal and generates a modulated optical signal, wherein the modulation part includes:
  a plurality of electro-absorption optical modulators disposed in series in an optical signal path of the input optical signal, and which each absorb light in accordance with an applied voltage, and
  a drive circuit to output the applied voltage to the electro-absorption optical modulators based on a modulation signal,
 wherein the plurality of electro-absorption optical modulators are electrically connected in series to each other.

6. The optical signal generator according to claim 5, further comprising:
 a plurality of electrical resistances that are respectively connected in parallel to the plurality of electro-absorption optical modulators.

7. The optical signal generator according to claim 5, further comprising:
 an electrical resistance that is connected to the drive circuit in parallel to the plurality of electro-absorption optical modulators connected in series to each other.

* * * * *